United States Patent
Su et al.

(10) Patent No.: US 10,084,413 B2
(45) Date of Patent: Sep. 25, 2018

(54) DOHERTY POWER AMPLIFIER AND TRANSMITTER

(71) Applicant: Huawei Technologies Co., Ltd., Shenzhen (CN)

(72) Inventors: Yongge Su, Shenzhen (CN); Lei Yang, Shenzhen (CN); Kun Wang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 26 days.

(21) Appl. No.: 15/362,502

(22) Filed: Nov. 28, 2016

(65) Prior Publication Data

US 2017/0077875 A1    Mar. 16, 2017

Related U.S. Application Data

(63) Continuation of application No. PCT/CN2014/078630, filed on May 28, 2014.

(51) Int. Cl.
*H03F 3/68* (2006.01)
*H03F 1/02* (2006.01)
(Continued)

(52) U.S. Cl.
CPC ........... *H03F 1/0288* (2013.01); *H03F 3/189* (2013.01); *H03F 3/211* (2013.01); *H03F 3/245* (2013.01);
(Continued)

(58) Field of Classification Search
CPC ........ H03F 1/0288; H03F 3/245; H03F 3/189; H03F 3/211
(Continued)

(56) References Cited

U.S. PATENT DOCUMENTS 6,940,349 B2 *  9/2005  Hellberg ............... H03F 1/0288
                                                 330/124 R
2003/0137346 A1  7/2003  Hellberg
(Continued)

FOREIGN PATENT DOCUMENTS

CN       1976217 A      6/2007
CN     101093978 A    12/2007
(Continued)

*Primary Examiner* — Khang V Nguyen
*Assistant Examiner* — Khiem Nguyen
(74) *Attorney, Agent, or Firm* — Leydig, Voit & Mayer, Ltd.

(57) ABSTRACT

A Doherty power amplifier (100) includes: a first amplification circuit (110), including a main power amplification branch and at least one auxiliary power amplification branch; a delay device (383), connected in the main power amplification branch; a combiner network (140), configured to: perform impedance inversion on the first amplification circuit (110), and couple an output end of the main power amplification branch and an output end of the at least one auxiliary power amplification branch to a load (160); and a first power divider (130), connected to an input end of the main power amplification branch and an input end of the at least one auxiliary power amplification branch, and configured to allocate an input signal of the first power divider (130) to the main power amplification branch and the at least one auxiliary power amplification branch.

19 Claims, 5 Drawing Sheets

(51) Int. Cl.
*H03F 3/21* (2006.01)
*H03F 3/189* (2006.01)
*H03F 3/24* (2006.01)

(52) U.S. Cl.
CPC ............... *H03F 2200/411* (2013.01); *H03F 2203/21103* (2013.01); *H03F 2203/21106* (2013.01); *H03F 2203/21142* (2013.01)

(58) Field of Classification Search
USPC .................. 330/295, 124 R, 84, 53, 310
See application file for complete search history.

(56) References Cited

U.S. PATENT DOCUMENTS

| | | |
|---|---|---|
| 2006/0103466 A1 | 5/2006 | Shah et al. |
| 2007/0126502 A1 | 6/2007 | Louis |
| 2008/0007331 A1 | 1/2008 | Suzuki et al. |
| 2012/0075018 A1 | 3/2012 | Gong et al. |
| 2013/0120061 A1 | 5/2013 | Van Der Zanden et al. |
| 2014/0125415 A1 | 5/2014 | Cui et al. |

FOREIGN PATENT DOCUMENTS

| | | |
|---|---|---|
| CN | 101488790 A | 7/2009 |
| CN | 101582682 A | 11/2009 |
| CN | 201699655 U | 1/2011 |
| CN | 102142812 A | 8/2011 |
| CN | 102170271 A | 8/2011 |
| CN | 102355198 A | 2/2012 |
| CN | 102545788 A | 7/2012 |
| CN | 102594265 A | 7/2012 |
| CN | 102594266 A | 7/2012 |
| CN | 102769431 A | 11/2012 |
| CN | 103208978 A | 7/2013 |
| EP | 2472718 A1 | 7/2012 |
| WO | WO 2004088837 A2 | 10/2004 |
| WO | WO 2011137832 A | 11/2011 |

* cited by examiner

DOHERTY POWER AMPLIFIER AND TRANSMITTER

CROSS-REFERENCE TO RELATED APPLICATIONS

This application is a continuation of International Application No. PCT/CN2014/078630, filed on May 28, 2014, the disclosure of which is hereby incorporated by reference in its entirety.

TECHNICAL FIELD

The present invention relates to the field of wireless communications, and in particular, to a Doherty (Doherty) power amplifier and a transmitter.

BACKGROUND

In a communications system, a radio frequency power amplifier and a microwave power amplifier are used to amplify a modulated radio frequency signal and a modulated microwave signal. To improve efficiency of spectrum utilization, modulation signals in many standards carry both phase information and amplitude information. For example, a Code Division Multiple Access (CDMA) signal, an orthogonal frequency division multiplexing (Orthogonal Frequency Division Multiplexing, OFDM) signal, and the like are non-constant envelope signals having a high peak-to-average ratio, and such signals require that a power amplifier not only has relatively good linearity at a peak output power, but also has relatively high efficiency at an average output power. A conventional class AB linear power amplifier has high efficiency only at the peak output power, and for a non-constant envelope signal having a high peak-to-average ratio, the conventional class AB linear power amplifier has very low efficiency at the average power.

To improve efficiency of a linear power amplifier during power back-off, a Doherty power amplifier is put forward. A common Doherty power amplifier may include at least two power amplifiers, where one power amplifier is a main power amplifier (Main Amplifier), which is also referred to as a carrier power amplifier, and is biased to a class AB working state; and the common Doherty power amplifier further includes one or more auxiliary power amplifiers (Auxiliary Amplifier), which are also referred to as peak power amplifiers (Peak Amplifier), and are biased to a class B or class C working state. In a case in which an input signal is less than a specified threshold, the auxiliary power amplifier does not achieve a function of amplifying the signal. Because of a function of a Doherty combiner network, when the auxiliary power amplifier does not achieve an amplification function, output impedance of the main power amplifier is in a high-impedance state. In this way, the main power amplifier can be saturated at a relatively low output power, thereby improving efficiency at the low output power. In an ideal state, when the input signal is higher than the specified threshold, an output power of the auxiliary power amplifier increases as an input power increases, which achieves an active-load pulling function for the main power amplifier. Output impedance of the main power amplifier decreases as an input power increases, and an output power increases as the input power increases. A working state of the main power amplifier is always in a saturated state, until the main power amplifier and the auxiliary power amplifier finally achieve saturated output simultaneously, thereby improving efficiency of an entire power amplifier during power back-off.

However, because a gain feature of a power amplifier biased to a class C working state is slowly turned on, before a power of an input signal of a main power amplifier reaches a specified threshold, an auxiliary power amplifier already starts to perform active-load pulling on the main power amplifier. As a result, the main power amplifier does not reach a saturated state when the input signal reaches the specified threshold, thereby affecting efficiency of the power amplifier.

SUMMARY

Embodiments of the present invention provide a Doherty power amplifier and a transmitter, so as to prevent an auxiliary power amplifier from generating active-load pulling before a main power amplifier reaches saturation, thereby improving efficiency of a power amplifier.

According to a first aspect, a Doherty power amplifier is provided, including: a first amplification circuit, including a main power amplification branch and at least one auxiliary power amplification branch, where the main power amplification branch includes a first main power amplifier, each auxiliary power amplification branch of the at least one auxiliary power amplification branch includes multiple levels of auxiliary power amplifiers, the main power amplification branch is configured to output an amplification signal to an output end of the main power amplification branch, and the at least one auxiliary power amplification branch is set to output an amplification signal to an output end of the at least one auxiliary power amplification branch when an output power of the first main power amplifier reaches a first threshold; a delay device, connected in the main power amplification branch, and configured to compensate for a delay difference between the main power amplification branch and the at least one auxiliary power amplification branch; a combiner network, configured to: perform impedance inversion on the first amplification circuit, and couple the output end of the main power amplification branch and the output end of the at least one auxiliary power amplification branch to a load; and a first power divider, connected to an input end of the main power amplification branch and an input end of the at least one auxiliary power amplification branch, and configured to allocate an input signal of the first power divider to the main power amplification branch and the at least one auxiliary power amplification branch.

In a first possible implementation manner, the Doherty power amplifier further includes: a second amplification circuit, including a second main power amplification branch and a second auxiliary power amplification branch that are connected in parallel, where the second main power amplification branch includes a second main power amplifier, the second auxiliary power amplification branch includes at least one level of second auxiliary power amplifier, the main power amplification branch is configured to output an amplification signal to an output end of the second amplification circuit, to drive the first main power amplifier, and the second auxiliary power amplification branch is set to output an amplification signal to the output end of the second amplification circuit when an output power of the second main power amplifier reaches a second threshold; and a second power divider, connected to an input end of the second main power amplification branch and an input end of the second auxiliary power amplification branch, and configured to allocate an input signal of the Doherty power amplifier to the second main power amplification branch and the second auxiliary power amplification branch, where the first power divider is coupled between the first amplification circuit and the second amplification circuit, and is configured to allocate, to the main power amplification branch and the at least one auxiliary power amplification branch, an amplification signal that is output by the second amplification circuit.

With reference to the first possible implementation manner, in a second possible implementation manner, the Doherty power amplifier further includes: a first impedance inversion component and a second impedance inversion component that are configured to perform impedance inversion on the second amplification circuit, where the first impedance inversion component is connected in series to the second main power amplifier, and the second impedance inversion component is connected between the first power divider and the first impedance inversion component.

With reference to the first possible implementation manner, in a third possible implementation manner, the Doherty power amplifier further includes: a first impedance inversion component, where the first impedance inversion component is connected in series to the second main power amplifier, the first power divider includes a second impedance inversion component and a coupled transmission line, the second impedance inversion component is connected between the output end of the second amplification circuit and the input end of the main power amplification branch, and is configured to perform impedance inversion on the second amplification circuit, one end of the coupled transmission line is connected to the input end of the at least one auxiliary power amplification branch, another end of the coupled transmission line is grounded, and the first impedance inversion component and the second impedance inversion component are configured to perform impedance inversion on the second amplification circuit.

With reference to any one of the first to the third possible implementation manners, in a fourth possible implementation manner, the Doherty power amplifier further includes: at least one second phase compensation transmission line, disposed in the second main power amplification branch and/or the second auxiliary power amplification branch, and configured to adjust a phase difference between the second main power amplification branch and the second auxiliary power amplification branch.

With reference to any one of the first to the fourth possible implementation manners, in a fifth possible implementation manner, the at least one level of second auxiliary power amplifier is biased to a class B or a class C, and the second main power amplifier is biased to a class AB.

With reference to the first or the second possible implementation manner, in a sixth possible implementation manner, the first power divider is a coupler.

With reference to any one of the first aspect, or the first to the sixth possible implementation manners, in a seventh possible implementation manner, the at least one auxiliary power amplification branch includes: one auxiliary power amplification branch, where multiple levels of auxiliary power amplifiers of the auxiliary power amplification branch are connected in series between an input end of the auxiliary power amplification branch and an output end of the auxiliary power amplification branch.

With reference to any one of the first aspect, or the first to the sixth possible implementation manners, in an eighth possible implementation manner, the Doherty power amplifier further includes: a third power divider, where the at least one auxiliary power amplification branch includes: multiple auxiliary power amplification branches, where an input end of the third power divider is coupled to an input end of the first main power amplifier by using the first power divider, and the third power divider is configured to allocate, to the multiple auxiliary power amplification branches, a signal that is output by the first power divider.

With reference to any one of the first aspect, or the first to the sixth possible implementation manners, in a ninth possible implementation manner, the at least one auxiliary power amplification branch includes: a third power divider, one first-level auxiliary power amplifier, and multiple second-level auxiliary power amplifiers, where an input end of the first-level auxiliary power amplifier is coupled to an input end of the first main power amplifier by using the first power divider, an input end of the third power divider is connected to an output end of the first-level auxiliary power amplifier, and the third power divider is configured to allocate, to the multiple second-level auxiliary power amplifiers, an amplification signal that is output by the first-level auxiliary power amplifier.

With reference to any one of the first aspect, or the first to the ninth possible implementation manners, in a tenth possible implementation manner, the Doherty power amplifier further includes: at least one first phase compensation transmission line, disposed in the main power amplification branch and/or the at least one auxiliary power amplification branch, and configured to adjust a phase difference between the main power amplification branch and the at least one auxiliary power amplification branch.

With reference to any one of the first aspect, or the first to the tenth possible implementation manners, in an eleventh possible implementation manner, the multiple levels of auxiliary power amplifiers are biased to the class B or the class C, and the first main power amplifier is biased to the class AB.

With reference to any one of the first aspect, or the first to the eleventh possible implementation manners, in a twelfth possible implementation manner, the combiner network includes: at least one impedance inverter, and the delay device is a delay line.

According to a second aspect, a Doherty power amplifier is provided, including: a first amplification circuit, including a main power amplification branch and at least one auxiliary power amplification branch, where the main power amplification branch includes a first main power amplifier, each auxiliary power amplification branch of the at least one auxiliary power amplification branch includes multiple levels of auxiliary power amplifiers, the main power amplification branch is configured to output an amplification signal to an output end of the main power amplification branch, and the at least one auxiliary power amplification branch is set to output an amplification signal to an output end of the at least one auxiliary power amplification branch when an output power of the first main power amplifier reaches a first threshold; a combiner network, configured to: perform impedance inversion on the first amplification circuit, and couple the output end of the main power amplification branch and the output end of the at least one auxiliary power amplification branch to a load; a second amplification circuit, including a second main power amplification branch and a second auxiliary power amplification branch that are connected in parallel, where the second main power amplification branch includes a second main power amplifier, the second auxiliary power amplification branch includes at least one level of second auxiliary power amplifier, the second main power amplification branch is configured to output an amplification signal to an output end of the second amplification circuit, to drive the first main power amplifier, and the second auxiliary power amplification branch is set to output an amplification signal to the output end of the second amplification circuit when an output power of the second main power amplifier reaches a second threshold; a first power divider, coupled between the first amplification circuit and the second amplification circuit, and configured to allocate an input signal of the first power divider to the main power amplification branch and the at least one auxiliary power amplification branch; and a second power divider, connected to an input end of the second main power amplification branch and an input end of the second auxiliary power amplification branch, and configured to allocate an input signal of the Doherty power amplifier to the second main power amplification branch and the second auxiliary power amplification branch.

With reference to the first possible implementation manner of the second aspect, in a first possible implementation manner, the Doherty power amplifier further includes: a first impedance inversion component and a second impedance inversion component that are configured to perform impedance inversion on the second amplification circuit, where the first impedance inversion component is connected in series to the second main power amplifier, and the second impedance inversion component is connected between the first power divider and the first impedance inversion component.

With reference to the first possible implementation manner of the second aspect, in a second possible implementation manner, the Doherty power amplifier further includes: a first impedance inversion component, where the first impedance inversion component is connected in series to the second main power amplifier, the first power divider includes a second impedance inversion component and a coupled transmission line, the second impedance inversion component is connected between the output end of the second amplification circuit and an input end of the main power amplification branch, and is configured to perform impedance inversion on the second amplification circuit, one end of the coupled transmission line is connected to an input end of the at least one auxiliary power amplification branch, another end of the coupled transmission line is grounded, and the first impedance inversion component and the second impedance inversion component are configured to perform impedance inversion on the second amplification circuit.

With reference to the first or the second possible implementation manner of the second aspect, in a third possible implementation manner, the at least one level of second auxiliary power amplifier is biased to a class B or a class C, and the second main power amplifier is biased to a class AB.

With reference to the second aspect, in a fourth possible implementation manner, the first power divider is a coupler.

With reference to any one of the second aspect, or the first to the fourth possible implementation manners of the second aspect, in a fifth possible implementation manner, the multiple levels of auxiliary power amplifiers are biased to the class B or the class C, and the first main power amplifier is biased to the class AB.

According to a third aspect, a transmitter is provided, including: a signal processor, configured to process a to-be-transmitted signal; a signal amplifier, where the signal amplifier is the Doherty power amplifier according to the first aspect or the second aspect, and is configured to amplify the signal processed by the signal processor; and a signal transmitter, configured to transmit the signal amplified by the signal amplification module.

According to the embodiments of the present invention, multiple levels of cascaded auxiliary power amplifiers may enable an auxiliary power amplifier in a Doherty power amplifier to be almost ideally shut down in terms of a specified threshold, and enable a main power amplifier to be closer to saturation in terms of the specified threshold, thereby improving efficiency of the main power amplifier. In addition, in the embodiments of the present invention, a delay device is further disposed in a main power amplification branch, and compensates for a group delay difference between the main power amplification branch and an auxiliary power amplification branch, thereby reducing adverse impact caused by the group delay difference to broadband performance of the Doherty power amplifier.

BRIEF DESCRIPTION OF DRAWINGS

To describe the technical solutions in the embodiments of the present invention more clearly, the following briefly describes the accompanying drawings required for describing the embodiments of the present invention. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

The following clearly describes the technical solutions in the embodiments of the present invention with reference to the accompanying drawings in the embodiments of the present invention. Apparently, the described embodiments are some but not all of the embodiments of the present invention. All other embodiments obtained by a person of ordinary skill in the art based on the embodiments of the present invention without creative efforts shall fall within the protection scope of the present invention.

To resolve the foregoing technical problem, drive amplifiers may be cascaded before an auxiliary power amplifier of a Doherty power amplifier, that is, multiple levels of auxiliary power amplifiers are used. A drive amplifier of an auxiliary power amplifier is also biased to a class C or is biased to a class approximate to a class C, so that an output gain feature of the auxiliary power amplifier has a higher slope, the auxiliary power amplifier is enabled to be almost ideally shut down in terms of a specified threshold, and a main power amplifier is enabled to be closer to saturation in terms of the specified threshold. However, an auxiliary power amplification branch of such a Doherty power amplifier includes multiple levels of auxiliary power amplifiers, each level of auxiliary power amplifier generates a corresponding group delay. The group delay refers to a delay that is generated, when a signal is transmitted by using a linear system or is transmitted by using a network, by the system or the network for the entire signal. Because a group delay difference exists between a main power amplification branch and the auxiliary power amplification branch, adverse impact is caused to broadband performance of the Doherty power amplifier.

The embodiments of the present invention provide a Doherty power amplifier and a transmitter, so as to improve efficiency of the power amplifier and reduce adverse impact caused by a group delay to broadband performance of the Doherty power amplifier.

Figure 1A:
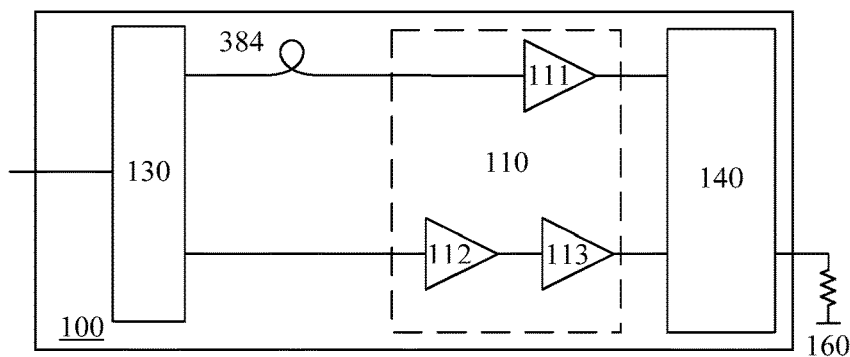
FIG. 1A is a block diagram of a circuit of a Doherty power amplifier according to an embodiment of the present invention.

FIG. 1A is a block diagram of a circuit of a Doherty power amplifier 100 according to an embodiment of the present invention. The Doherty power amplifier 100 includes: a first amplification circuit 110, a first power divider 130, a combiner network 140, and a delay device 384.

The first amplification circuit 110 includes a main power amplification branch and at least one auxiliary power amplification branch, where the main power amplification branch includes a first main power amplifier 111, each auxiliary power amplification branch of the at least one auxiliary power amplification branch includes multiple levels of auxiliary power amplifiers 112 and 113, the main power amplification branch is configured to output an amplification signal to an output end of the main power amplification branch, and the at least one auxiliary power amplification branch is set to output an amplification signal to an output end of the at least one auxiliary power amplification branch when an output power of the first main power amplifier 111 reaches a first threshold.

In other words, the main power amplification branch is connected in parallel to the at least one auxiliary power amplification branch. One auxiliary power amplification branch of the at least one auxiliary power amplification branch achieves an active-load pulling function for the main power amplification branch. For example, when the output power of the first main power amplifier 111 reaches the first threshold, the auxiliary power amplification branch outputs an amplification signal, output impedance of the first main power amplifier 111 decreases as an input power increases, and the output power of the first main power amplifier 111 increases as the input power increases, so that a working state of the first main power amplifier 111 is always in a saturated state, until the first main power amplifier 111 and multiple levels of auxiliary power amplifiers of the auxiliary power amplification branch finally achieve saturated output simultaneously, thereby improving efficiency of an entire power amplifier during power back-off. In addition, when two or more auxiliary power amplification branches exist, the auxiliary power amplification branches may achieve an active-load pulling function for the main power amplification branch and an auxiliary power amplification branch that already start to work. Multiple levels of auxiliary power amplifiers of each auxiliary power amplification branch include a first-level auxiliary power amplifier 112 and a second-level auxiliary power amplifier 113, where the first-level auxiliary power amplifier 112 is configured to drive the second-level auxiliary power amplifier 113.

The delay device 384 is connected in the main power amplification branch. For example, the delay device 384 is connected in series to the first main power amplifier 111, and is configured to compensate for a delay difference between the main power amplification branch and the at least one auxiliary power amplification branch.

The combiner network 140 is configured to: perform impedance inversion on the first amplification circuit 110, and couple the output end of the main power amplification branch and the output end of the at least one auxiliary power amplification branch to a load 160, to implement active-load pulling of the auxiliary power amplification branch on the main power amplification branch.

The first power divider 130 is connected to an input end of the main power amplification branch and an input end of the at least one auxiliary power amplification branch, and is configured to allocate an input signal of the first power divider 130 to the main power amplification branch and the at least one auxiliary power amplification branch.

Specifically, the delay device may be a device that delays an electrical signal in a circuit for a particular time and then outputs the signal. For an analog signal, the delay device may include an inductor and a capacitor or directly use a coaxial cable and a helix; for a digital signal, the delay device may further use a charge coupled device or a surface acoustic wave device. The delay device may provide a group delay.

In this embodiment of the present invention, because the multiple levels of auxiliary power amplifiers are disposed in the auxiliary power amplification branch, each level of auxiliary power amplifier generates a corresponding group delay (for example, 2 ns). An excessively large group delay difference between the main power amplification branch and the auxiliary power amplification branch causes adverse impact on broadband performance of the power amplifier. Although a phase compensation line in the main power amplification branch or the auxiliary power amplification branch may be adjusted to enable phases of center frequencies of the two branches to be aligned, a phase difference between the two branches deviating from the center frequency becomes larger at another frequency. In this embodiment of the present invention, the delay device is disposed in the main power amplification branch, which can compensate for the group delay difference between the foregoing two branches.

According to this embodiment of the present invention, multiple levels of cascaded auxiliary power amplifiers may enable an auxiliary power amplifier in a Doherty power amplifier to be almost ideally shut down in terms of a specified threshold, and enable a main power amplifier to be closer to saturation in terms of the specified threshold, thereby improving efficiency of the main power amplifier. In addition, in this embodiment of the present invention, a delay device is further disposed in a main power amplification branch, and compensates for a group delay difference between the main power amplification branch and an auxiliary power amplification branch, thereby reducing adverse impact caused by the group delay difference to broadband performance of the Doherty power amplifier.

According to this embodiment of the present invention, the first power divider 130 is a coupler.

The first power divider 130 may use multiple splitter forms, such as a Wilkinson splitter, a Hybrid bridge, a hybrid ring, and a directional coupler.

The Doherty power amplifier according to this embodiment of the present invention may further include: at least one first phase compensation transmission line, disposed in the main power amplification branch and/or the at least one auxiliary power amplification branch, and configured to adjust a phase difference between the main power amplification branch and the at least one auxiliary power amplification branch.

According to this embodiment of the present invention, to enable phases of the main power amplification branch and the auxiliary power amplification branch to be consistent at a combining point, to reduce power losses, a phase compensation transmission line (which is also referred to as an Offset transmission line) may be further disposed in the main power amplification branch and/or the at least one auxiliary power amplification branch. The phase compensation transmission line may be disposed in the main power amplification branch, or may be disposed in the auxiliary power amplification branch, which is not limited in this embodiment of the present invention.

According to this embodiment of the present invention, the foregoing multiple levels of auxiliary power amplifiers are biased to a class B or a class C, and the first main power amplifier is biased to a class AB.

Working state of a power amplifier may be generally classified into a class A (which is also referred to as a class A), a class B (which is also referred to as a class B), a class C, and a class AB (which is also referred to as a class AB), where a class A power amplifier is a linear power amplifier; a class B power amplifier is also a linear power amplifier whose working principle is different from that of the class A power amplifier; a class AB power amplifier is between the class A power amplifier and the class B power amplifier, and has advantages of the class A power amplifier and the class B power amplifier; a class C power amplifier is a non-linear power amplifier.

According to this embodiment of the present invention, the combiner network includes at least one impedance inverter. For example, the combiner network may be an impedance inverter network (INN). The impedance inverter may be a ¼ wavelength transmission line. The impedance inverter may be disposed in the main power amplification branch, for example, disposed at an output end of the first main power amplifier, and this embodiment of the present invention is not limited thereto. For example, in an anti-Doherty design, the ¼ wavelength transmission line may be disposed at an output end of an auxiliary power amplifier. Alternatively, in this embodiment of the present invention, the combiner network may be implemented by using a hybrid bridge that can achieve an active-load pulling function. A form of the combiner network is not limited in this embodiment of the present invention.

According to this embodiment of the present invention, the foregoing at least one auxiliary power amplification branch includes: one auxiliary power amplification branch, where multiple levels of auxiliary power amplifiers (such as a first-level auxiliary power amplifier 112 and a second-level auxiliary power amplifier 113) of the auxiliary power amplification branch may be connected in series between an input end of the auxiliary power amplification branch and an output end of the auxiliary power amplification branch.

For ease of description, two levels of auxiliary power amplifiers 112 and 113 are used as an example for description in FIG. 1A. A person skilled in the art may understand that the foregoing at least one auxiliary power amplification branch may include multiple auxiliary power amplification branches, and each auxiliary power amplification branch may include multiple levels of auxiliary power amplifiers.

A Doherty power amplifier including multiple auxiliary power amplification branches is described below with reference to FIG. 1B to FIG. 1D. Embodiments in FIG. 1B to FIG. 1D are examples of FIG. 1A, and detailed descriptions are appropriately omitted herein.

Figure 1B:
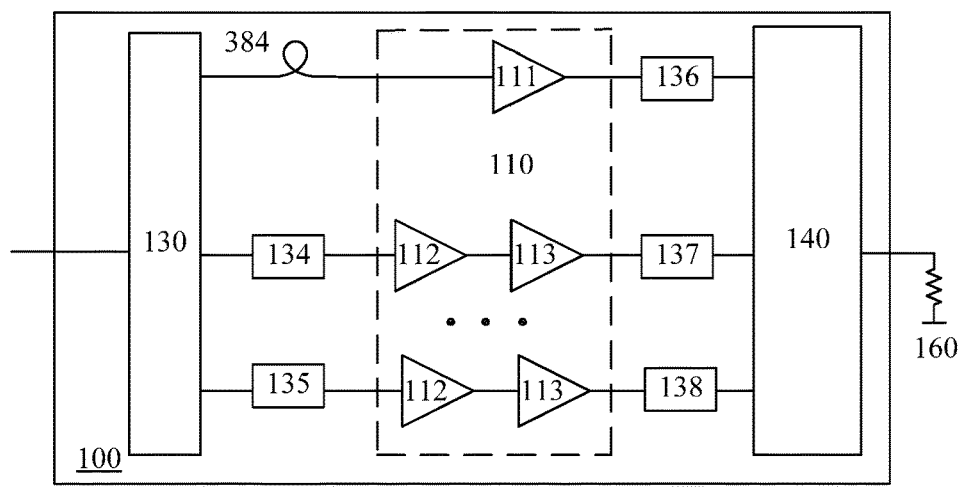
FIG. 1B is a block diagram of a circuit of a Doherty power amplifier according to another embodiment of the present invention.
Figure 1C:
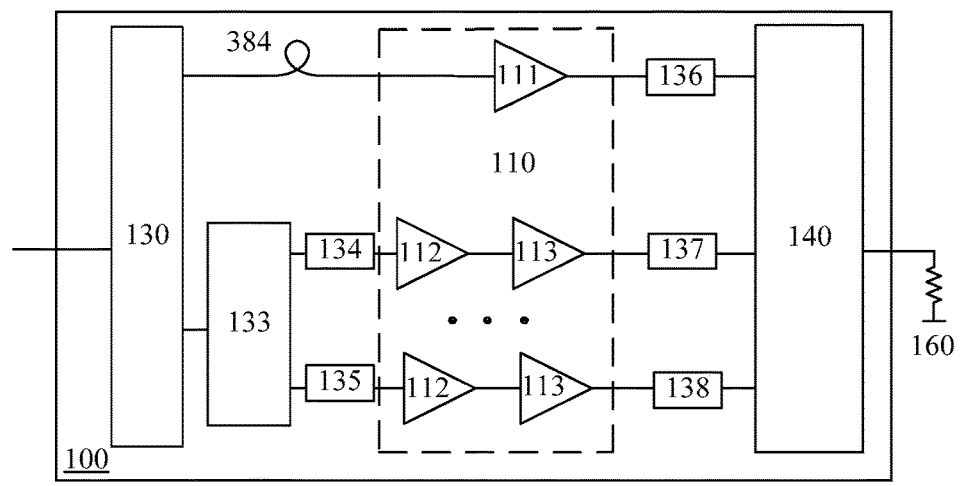
FIG. 1C is a block diagram of a circuit of a Doherty power amplifier according to still another embodiment of the present invention.
Figure 1D:
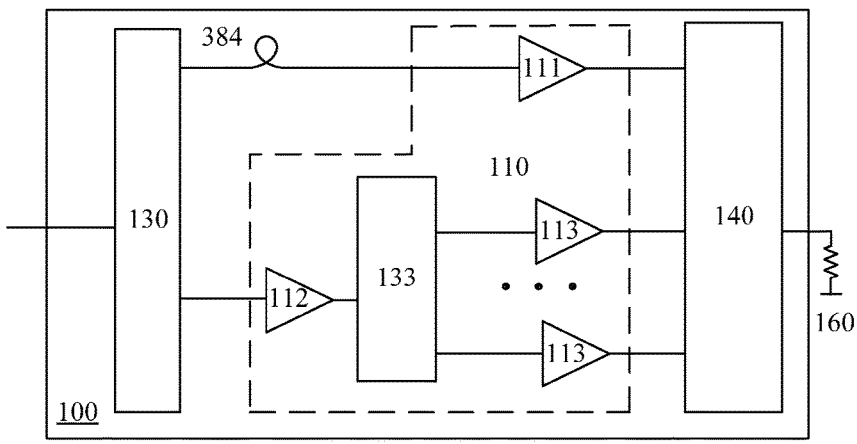
FIG. 1D is a block diagram of a circuit of a Doherty power amplifier according to yet another embodiment of the present invention.

FIG. 1B is a block diagram of a circuit of a Doherty power amplifier according to another embodiment of the present invention. For example, the first power divider 130 may include N-way output, one-way output is connected to a main power amplification branch, and (N−1)-way output is connected to an auxiliary power amplification branch.

According to this embodiment of the present invention, to enable phases of N branches to be consistent at a combining point, to reduce power losses, a phase compensation transmission line (which is also referred to as an Offset transmission line) may be further disposed in a maximum of N−1 branches of the N branches. For example, an Offset 134 is set at an input end of the first-level auxiliary power amplifier 112, and an Offset 135 is set at an input end of the second-level auxiliary power amplifier 113. Removing an Offset transmission line from the auxiliary power amplification branch is equivalent to adding an Offset transmission line to the main power amplification branch. Therefore, for an N-way Doherty power amplifier, phases of all branches can be adjusted to be consistent as long as an Offset transmission line is disposed in a maximum of N−1 branches.

In addition, because a delay line is long enough, one level of power amplifier is compensated by approximately 2 ns (which is equivalent to multiple carrier periods), and no more than one carrier period is required for compensation by an Offset transmission line. Therefore, an offset transmission line may be not disposed on the auxiliary power amplification branch, but a length of the delay line is slightly increased or decreased. In this way, the Offset transmission line may be used as a part of a transmission line, and implement a line layout and phase compensation, and an obvious physical device does not need to be disposed.

Alternatively, the delay device may be implemented by using a filter network. Because the filter network cannot randomly adjust a phase shift, adjustment may be performed in a manner of adding an Offset transmission line.

In addition, an Offset transmission line may be further disposed at an output end of the foregoing power amplifier, where a function of the Offset transmission line is to compensate for a phase shift of a matching network and a packaged parasitic parameter of a power tube of the power amplifier, so that a pure resistive load of a port of the combiner network is still a pure resistive load when the pure resistive load of the port of the combiner network is inverted into the power tube. For example, an Offset 136 is disposed at an output end of a main power amplifier 111, and an Offset 137 and an Offset 138 are disposed at output ends of auxiliary power amplifiers 113 of multiple auxiliary power amplification branches.

FIG. 1C is a block diagram of a circuit of a Doherty power amplifier according to still another embodiment of the present invention. The Doherty power amplifier in FIG. 1C further includes: a third power divider 133, where the foregoing at least one auxiliary power amplification branch includes multiple auxiliary power amplification branches. An input end of the third power divider 133 is coupled to an input end of the first main power amplifier 111 by using the first power divider 130. The third power divider 133 is configured to allocate, to the multiple auxiliary power amplification branches, a signal that is output by the first power divider 130.

Similarly, to enable phases of N branches to be consistent at a combining point, a phase compensation line (which is also referred to as an Offset) may be disposed in a maximum of N−1 branches. An Offset 134 to an Offset 138 in FIG. 1C are similar to the Offset 134 to the Offset 138 in FIG. 1B, and are not described in detail herein again.

FIG. 1D is a block diagram of a circuit of a Doherty power amplifier according to yet another embodiment of the present invention. The at least one auxiliary power amplification branch includes: a third power divider 133, one first-level auxiliary power amplifier 112, and multiple second-level auxiliary power amplifiers 113. An input end of the first-level auxiliary power amplifier 112 is coupled to an input end of the first main power amplifier 111 by using the first power divider 130. An input end of the third power divider 133 is connected to an output end of the first-level auxiliary power amplifier 112. The third power divider 133 is configured to allocate, to the multiple second-level auxiliary power amplifiers 113, an amplification signal that is output by the first-level auxiliary power amplifier 112.

Similarly, to enable phases of N branches to be consistent at a combining point, a phase compensation line (which is also referred to as an Offset) (which is not shown in FIG. 1D) may be disposed in a maximum of N−1 branches in FIG. 1D.

Figure 2:
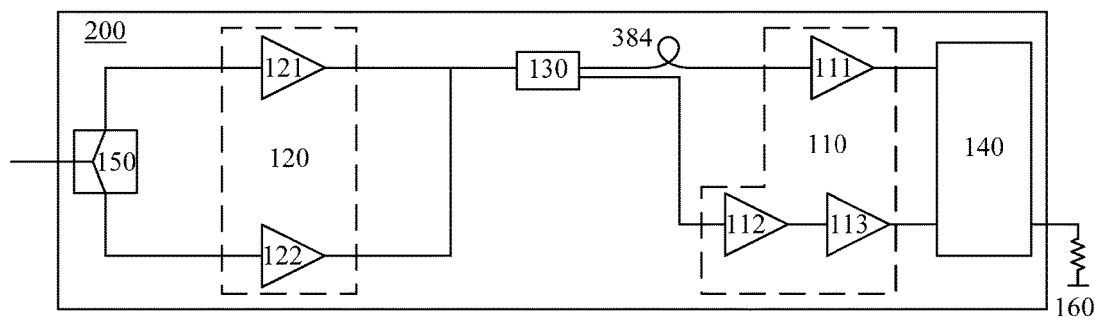
FIG. 2 is a block diagram of a circuit of a Doherty power amplifier according to another embodiment of the present invention.

FIG. 2 is a block diagram of a circuit of a Doherty power amplifier 200 according to another embodiment of the present invention. The Doherty power amplifier 200 in FIG. 2 is an example of the embodiment in FIG. 1A. The Doherty power amplifier 200 includes: a first amplification circuit 110, a second amplification circuit 120, a first power divider 130, a combiner network 140, a second power divider 150, and a delay device 384. The first amplification circuit 110 is also referred to as an end-level amplification circuit, and the second amplification circuit 120 is also referred to as a drive-level amplification circuit.

The first amplification circuit 110 includes a main power amplification branch and at least one auxiliary power amplification branch, where the main power amplification branch includes a first main power amplifier 111, each auxiliary power amplification branch of the at least one auxiliary power amplification branch includes multiple levels of auxiliary power amplifiers, the main power amplification branch is configured to output an amplification signal to an output end of the main power amplification branch, and the at least one auxiliary power amplification branch is set to output an amplification signal to an output end of the at least one auxiliary power amplification branch when an output power of the first main power amplifier 111 reaches a first threshold.

The delay device 384 is connected in the main power amplification branch. For example, the delay device 384 is connected in series to the first main power amplifier 111, and is configured to compensate for a delay difference between the main power amplification branch and the at least one auxiliary power amplification branch.

The combiner network 140 is configured to: perform impedance inversion on the first amplification circuit 110, and couple the output end of the main power amplification branch and the output end of the at least one auxiliary power amplification branch to a load 160. The combiner network 140 may include an impedance inversion component, for example, a ¼ wavelength line.

The second amplification circuit 120 includes a second main power amplification branch and a second auxiliary power amplification branch that are connected in parallel, where the second main power amplification branch includes a second main power amplifier 121, the second auxiliary power amplification branch includes at least one level of second auxiliary power amplifier 122, the second main power amplification branch is configured to output an amplification signal to an output end of the second amplification circuit 120, to drive the first main power amplifier 111, and the second auxiliary power amplification branch is set to output an amplification signal to the output end of the second amplification circuit 120 when an output power of the second main power amplifier 121 reaches a second threshold.

Specifically, the second main power amplifier 121 is configured to drive the first main power amplifier 111, and the second auxiliary power amplifier 122 achieves an active-load pulling function for the second main power amplifier 121.

Load impedance of the first main power amplifier is in a high-impedance state before an auxiliary branch is turned on. In the high-impedance state, the first main power amplifier reaches a saturated working state in advance at a relatively low output power, and reaches peak efficiency at a power back-off point. Using a 2-way (2 Way) Doherty as an example, if a peak output power of a first main power amplifier is Pa_max (which has a unit of W), and a peak output power of an auxiliary power amplifier is Pp_max (which has a unit of W), an advance saturation power point back-off amount is Pp_max/(Pp_max+Pa_max) (which has a unit of dB). In a design of an auxiliary power amplification branch, the power back-off point should be used as a turn-on point, that is, the first threshold may be determined according to a power at the turn-on point. For example, the power at the turn-on point may be used as the first threshold. A turn-on feature of the auxiliary power amplification branch is jointly determined according to bias conditions of the multiple levels of auxiliary power amplifiers of the auxiliary power amplification branch.

The first power divider 130 is coupled between the first amplification circuit 110 and the second amplification circuit 120, and is configured to allocate, to an input end of the main power amplification branch and an input end of the at least one auxiliary power amplification branch, an amplification signal that is output by the second amplification circuit 120.

The second power divider 150 is connected to an input end of the second main power amplification branch and an input end of the second auxiliary power amplification branch, and is configured to allocate an input signal of the Doherty power amplifier to the second main power amplification branch and the second auxiliary power amplification branch. The first power divider 130 is coupled between the first amplification circuit 110 and the second amplification circuit 120, and is configured to allocate, to the main power amplification branch and the at least one auxiliary power amplification branch, an amplification signal that is output by the second amplification circuit 120. The first power divider 130 may also use multiple splitter forms, such as a Wilkinson splitter, a Hybrid bridge, a hybrid ring, and a directional coupler.

According to this embodiment of the present invention, multiple levels of cascaded auxiliary power amplifiers may enable an auxiliary power amplifier in a Doherty power amplifier to be almost ideally shut down in terms of a specified threshold, and enable a main power amplifier to be closer to saturation in terms of the specified threshold, thereby improving efficiency of the main power amplifier. In addition, in this embodiment of the present invention, a delay device is further disposed in a main power amplification branch, and compensates for a group delay difference between the main power amplification branch and an auxiliary power amplification branch, thereby reducing adverse impact caused by the group delay difference to broadband performance of the Doherty power amplifier.

In addition, an auxiliary power amplifier connected in parallel to a drive amplifier of the main power amplifier achieves an active-load pulling function for the drive amplifier, so that efficiency of the drive amplifier during power back-off is approximate to saturation efficiency, thereby improving efficiency of an entire power amplifier.

Because an auxiliary branch in this embodiment of the present invention uses multiple levels of auxiliary power amplifiers, leading to a relatively high gain of the auxiliary branch, the first power divider may be implemented by using a form of mutually coupled transmission lines. Because a coupler having a relatively low coupling factor may be used in this embodiment of the present invention, a coupled transmission line may be used to replace a conventional splitter. In this way, it is relatively easy to implement the coupler, and impact on impedance of the transmission line can be ignored. In addition, because for an auxiliary power amplifier, a class C power amplifier is usually used, and an input standing wave of the class C power amplifier changes as an input power changes, an isolator generally needs to be added to an input end of a Doherty power amplifier. In this embodiment of the present invention, a coupler having a very low coupling factor may be used to replace a conventional splitter, and impact on a standing wave of an auxiliary power amplification branch is relatively small. Therefore, the isolator can be removed, to reduce material costs.

Figure 3:
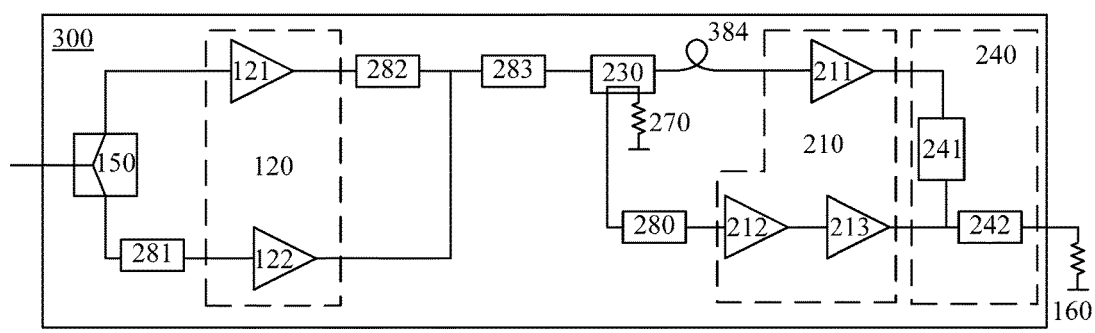
FIG. 3 is a schematic diagram of a circuit of a Doherty power amplifier according to still another embodiment of the present invention.

FIG. 3 is a schematic diagram of a circuit of a Doherty power amplifier 300 according to still another embodiment of the present invention. The Doherty power amplifier 300 in FIG. 3 is an example of the Doherty power amplifier 200 in FIG. 2, and detailed descriptions are appropriately omitted herein.

The Doherty power amplifier 300 in FIG. 3 includes: a first amplification circuit 210, a second amplification circuit 120, a first power divider 230, a combiner network 240, a second power divider 150, and a delay device 384. The first amplification circuit 210 includes a first main power amplifier 211, a first-level auxiliary power amplifier 212, and a second-level auxiliary power amplifier 213. The combiner network 240 includes: a sixth impedance inversion component 241 and a seventh impedance inversion component 242. The first power divider 230 may be a coupler. An impedance inversion component may be an impedance inverter.

The Doherty power amplifier 300 further includes: at least one first phase compensation transmission line 280, disposed in a main power amplification branch and/or at least one auxiliary power amplification branch, and configured to adjust a phase difference between the main power amplification branch and the at least one auxiliary power amplification branch; at least one second phase compensation transmission line 281, disposed in a second main power amplification branch and/or a second auxiliary power amplification branch, and configured to adjust a phase difference between the second main power amplification branch and the second auxiliary power amplification branch; a first impedance inversion component 282 and a second impedance inversion component 283, configured to perform impedance inversion on the second amplification circuit 120, where the first impedance inversion component 282 is connected in series to the second main power amplifier 121, and the second impedance inversion component 283 is connected between the first power divider 230 and the first impedance inversion component 282.

Specifically, a first output end of the second power divider 150 is connected to an input end of the second main power amplifier 121. A second output end of the second power divider 150 is connected to a first end of the second phase compensation transmission line 281. An output end of the second main power amplifier 121 is connected to a first end of the first impedance inversion component 282. A second end of the first impedance inversion component 282 is connected to a first end of the second impedance inversion component 283. A second end of the second phase compensation transmission line 281 is connected to an input end of the second auxiliary power amplifier 122. An output end of the second auxiliary power amplifier 122 is connected to the first end of the second impedance inversion component 283, and a second end of the second impedance inversion component 283 is connected to an input end of the coupler 230. For example, the first impedance inversion component 282 and the second impedance inversion component 283 may be ¼ wavelength lines.

Alternatively, the second phase compensation transmission line 281 may be disposed in the main power amplification branch.

The second phase compensation transmission line 281 is configured to compensate for a phase difference of 90° of the first impedance inversion component 282. If the second main power amplifier 121 is different from the second auxiliary power amplifier 122, the second phase compensation transmission line 281 may further compensate for a phase difference between the first auxiliary power amplifier 121 and the second auxiliary power amplifier 122.

A straight-through end of the coupler 230 is connected to an input end of the first main power amplifier 211. A coupling end of the coupler 230 is connected to a first end of the first phase compensation transmission line 280, and an isolation end of the coupler 230 is grounded by using an impedor 270. The second end of the first phase compensation transmission line 280 is connected to an input end of the first-level auxiliary power amplifier 212. An output end of the first main power amplifier 211 is connected to a first end of the sixth impedance inversion component 241. The second end of the first phase compensation transmission line 280 is connected to the input end of the first-level auxiliary power amplifier 212, and an output end of the first-level auxiliary power amplifier 212 is connected to an input end of the second-level auxiliary power amplifier 213. An output end of the second-level auxiliary power amplifier 213 is connected to a second end of the sixth impedance inversion component 241, and is connected to a first end of the seventh impedance inversion component 242. A second end of the seventh impedance inversion component 242 is connected to a load 160.

According to this embodiment of the present invention, multiple levels of cascaded auxiliary power amplifiers may enable an auxiliary power amplifier in a Doherty power amplifier to be almost ideally shut down in terms of a specified threshold, and enable a main power amplifier to be closer to saturation in terms of the specified threshold, thereby improving efficiency of the main power amplifier. An auxiliary power amplifier connected in parallel to a drive amplifier of the main power amplifier achieves an active-load pulling function for the drive amplifier, so that efficiency of the drive amplifier during power back-off is approximate to saturation efficiency, thereby improving efficiency of an entire power amplifier. In addition, in this embodiment of the present invention, a delay device is further disposed in a main power amplification branch, and compensates for a group delay difference between the main power amplification branch and an auxiliary power amplification branch, thereby reducing adverse impact caused by the group delay difference to broadband performance of the Doherty power amplifier.

In addition, in this embodiment of the present invention, a delay device configured to compensate for a group delay is disposed in the main power amplification branch, thereby reducing or avoiding adverse impact caused by a group delay difference between the main power amplification branch and the auxiliary power amplification branch on broadband performance of a power amplifier.

Figure 4:
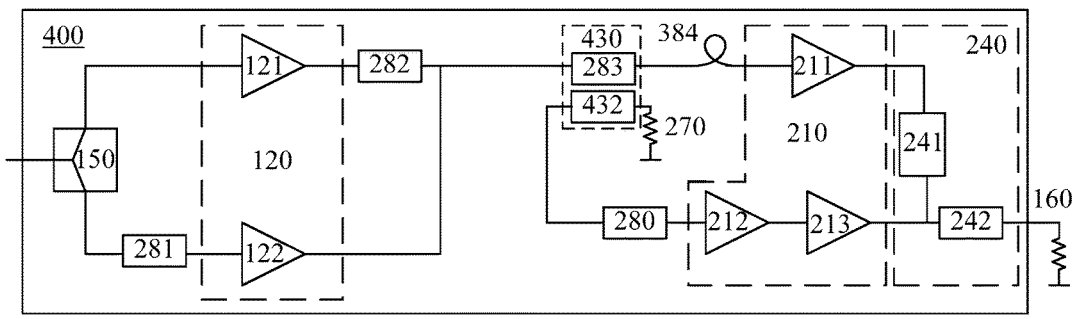
FIG. 4 is a schematic diagram of a circuit of a Doherty power amplifier according to yet another embodiment of the present invention.

FIG. 4 is a schematic diagram of a circuit of a Doherty power amplifier 400 according to yet another embodiment of the present invention. The Doherty power amplifier 400 in FIG. 4 is an example of the Doherty power amplifier 300 in FIG. 3, and detailed descriptions are appropriately omitted herein.

The Doherty power amplifier 400 includes: a first amplification circuit 210, a second amplification circuit 120, a first power divider 430, a combiner network 240, a second power divider 150, a first phase compensation transmission line 280, a second phase compensation transmission line 281, a first impedance inversion component 282, and a delay device 384. Except the first power divider 430, the foregoing circuit components are similar to those of the Doherty power amplifier 300 in FIG. 3, and details are not described herein again.

Different from the Doherty power amplifier 300 in FIG. 3, the first power divider 430 may include a second impedance inversion component 283 and a second transmission line 432. A first end of the second impedance inversion component 283 is connected to a second end of the first impedance inversion component 282, a second end of the second impedance inversion component 283 is connected to an input end of the first main power amplifier 211, a first end of the second transmission line 432 is connected to a first end of the first phase compensation transmission line 280, and a second end of the second transmission line 432 is grounded by using an impedor 270.

According to this embodiment of the present invention, multiple levels of cascaded auxiliary power amplifiers may enable an auxiliary power amplifier in a Doherty power amplifier to be almost ideally shut down in terms of a specified threshold, and enable a main power amplifier to be closer to saturation in terms of the specified threshold, thereby improving efficiency of the main power amplifier. An auxiliary power amplifier connected in parallel to a drive amplifier of the main power amplifier achieves an active-load pulling function for the drive amplifier, so that efficiency of the drive amplifier during power back-off is approximate to saturation efficiency, thereby improving efficiency of an entire power amplifier. In addition, in this embodiment of the present invention, a delay device is further disposed in a main power amplification branch, and compensates for a group delay difference between the main power amplification branch and an auxiliary power amplification branch, thereby reducing adverse impact caused by the group delay difference to broadband performance of the Doherty power amplifier.

In addition, in this embodiment of the present invention, a delay device configured to compensate for a group delay is disposed in the main power amplification branch, thereby reducing or avoiding adverse impact caused by a group delay difference between the main power amplification branch and the auxiliary power amplification branch on broadband performance of a power amplifier.

In addition, because an impedance inversion component at an output end of the first amplification circuit may be directly used to implement a function of a coupler, material costs and an area of a circuit topology are reduced.

Figure 5:
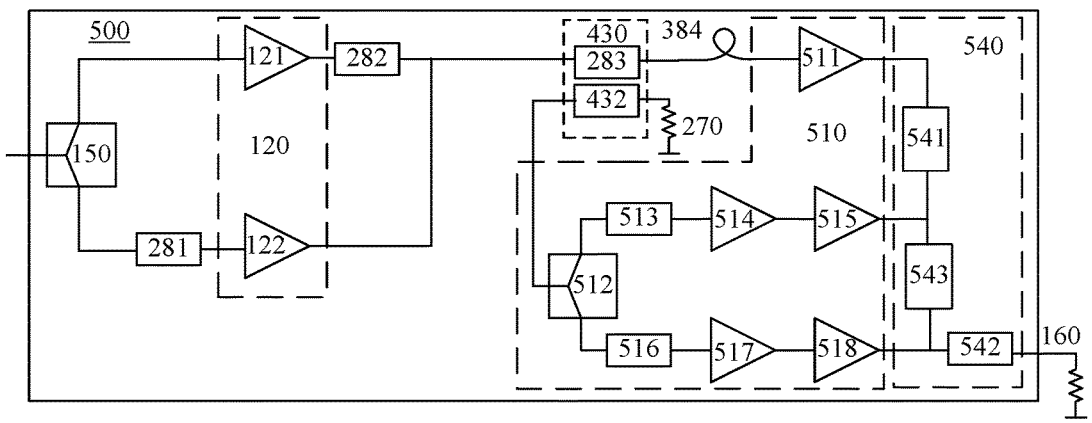
FIG. 5 is a schematic diagram of a circuit of a Doherty power amplifier according to another embodiment of the present invention.

FIG. 5 is a schematic diagram of a circuit of a Doherty power amplifier 500 according to another embodiment of the present invention. The Doherty power amplifier 500 in FIG. 5 is an example of the Doherty power amplifier 100 in FIG. 3, and detailed descriptions are appropriately omitted herein.

The Doherty power amplifier 500 includes: a first amplification circuit 510, a second amplification circuit 120, a first power divider 430, a combiner network 540, a second power divider 150, a first phase compensation transmission line 280, a second phase compensation transmission line 281, a first impedance inversion component 282, and a delay device 384. The second amplification circuit 120, the second power divider 150, the first phase compensation transmission line 280, the second phase compensation transmission line 281, the first impedance inversion component 282, and the delay device 384 of the Doherty power amplifier 500 are similar to corresponding circuit components of the Doherty power amplifier 300 in FIG. 3, and are not described in detail herein again.

Different from the Doherty power amplifier 300 in FIG. 3, the first power divider 430 may include a second impedance inversion component 283 and a second transmission line 432.

The Doherty power amplifier 500 further includes: a third power divider 512. At least one auxiliary power amplification branch includes: multiple auxiliary power amplification branches. An input end of the third power divider 512 is coupled to an input end of a first main power amplifier 511 by using the first power divider 430. The third power divider 512 is configured to allocate, to the multiple auxiliary power amplification branches, a signal allocated by the first power divider 430 to the multiple auxiliary power amplification branches.

The embodiment in FIG. 5 is described by using two auxiliary power amplification branches as an example. A first auxiliary power amplification branch includes a phase compensation transmission line 513, a first-level auxiliary power amplifier 514, and a second-level auxiliary power amplifier 515. A second auxiliary power amplification branch includes a phase compensation transmission line 516, a first-level auxiliary power amplifier 517, and a second-level auxiliary power amplifier 518.

Correspondingly, the combiner network 540 includes: a sixth impedance inversion component 541, a seventh impedance inversion component 542, and a third impedance inversion component 543. A first end of the sixth impedance inversion component 541 is connected to an output end of a main power amplification branch, and a second end of the sixth impedance inversion component 541 is connected to an output end of a first auxiliary amplification branch. A first end of the seventh impedance inversion component 542 is connected to an output end of the second auxiliary power amplification branch, and a second end of the seventh impedance inversion component 542 is connected to a load. The third impedance inversion component 543 is connected between the output end of the first auxiliary power amplification branch and the output end of the second auxiliary power amplification branch.

Specifically, a first end of the second impedance inversion component 283 is connected to a second end of the first impedance inversion component 282, and a second end of the second impedance inversion component 283 is connected to the input end of the first main power amplifier 511. A first end of the second transmission line 432 is connected to the input end of the third power divider 512, and a second end of the second transmission line 432 is grounded by using an impedor 270. An output end of the first main power amplifier 511 is connected to the first end of the sixth impedance inversion component 541. A first output end of the third power divider 512 is connected to a first end of the phase compensation transmission line 513, a second end of the phase compensation transmission line 513 is connected to an input end of the first-level auxiliary power amplifier 514, and an output end of the first-level auxiliary power amplifier 514 is connected to an input end of the second-level auxiliary power amplifier 515. A second output end of the third power divider 512 is connected to a first end of the phase compensation transmission line 516, a second end of the phase compensation transmission line 516 is connected to an input end of the first-level auxiliary power amplifier 517, and an output end of the first-level auxiliary power amplifier 517 is connected to an input end of the second-level auxiliary power amplifier 518. An output end of the second-level auxiliary power amplifier 515 is connected to a second end of the sixth impedance inversion component 541, and is connected to a first end of the third impedance inversion component 543. An output end of the second-level auxiliary power amplifier 518 is connected to a second end of the third impedance inversion component 543, and is connected to a first end of the seventh impedance inversion component 542. A second end of the seventh impedance inversion component 542 is connected to a load 160.

According to this embodiment of the present invention, multiple levels of cascaded auxiliary power amplifiers may enable an auxiliary power amplifier in a Doherty power amplifier to be almost ideally shut down in terms of a specified threshold, and enable a main power amplifier to be closer to saturation in terms of the specified threshold, thereby improving efficiency of the main power amplifier. An auxiliary power amplifier connected in parallel to a drive amplifier of the main power amplifier achieves an active-load pulling function for the drive amplifier, so that efficiency of the drive amplifier during power back-off is approximate to saturation efficiency, thereby improving efficiency of an entire power amplifier.

In addition, in a case in which multiple auxiliary power amplification branches are used, all auxiliary power amplifiers of the auxiliary power amplification branches may be biased to a class C, and the multiple auxiliary power amplification branches are separately turned on at different input power thresholds. A 3 Way Doherty (3-way Doherty) power amplifier is used as an example. When a power of an input signal is less than a threshold 1, only a main power amplification branch achieves a function of amplifying the input signal, and is saturated at the threshold 1. When the power of the input signal is greater than the threshold 1, a first auxiliary power amplification branch is turned on, and performs active-load pulling on the main power amplification branch, the first auxiliary power amplification branch is saturated at a threshold 2, and a first main power amplifier is always in a saturated state when the power of the input signal changes from the threshold 1 to the threshold 2. When the power of the input signal is greater than the threshold 2, a second auxiliary power amplification branch is turned on, and performs active-load pulling on the main power amplification branch and the first auxiliary power amplification branch, until the three branches finally achieve saturated output simultaneously, and in a process in which the power of the input signal is greater than the threshold 2, the main power amplification branch and the first auxiliary power amplification branch are always saturated. Compared with a 2 Way Doherty, the 3-way Doherty power amplifier has one more peak efficiency point, can provide high efficiency in a larger back-off range, and is applicable to high-efficiency amplification on a signal having a higher peak-to-average ratio. It should be understood by a person skilled in the art that such a mode of operation may be extended to an N Way Doherty.

Figure 6:
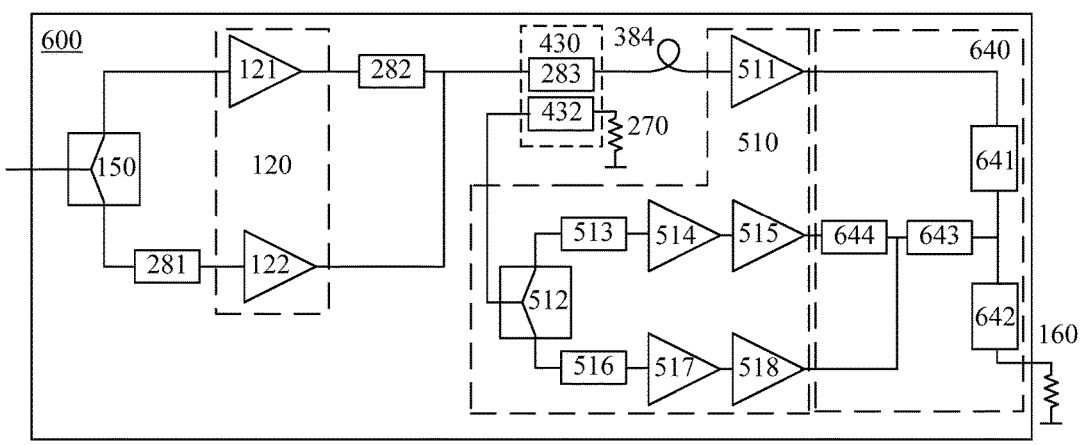
FIG. 6 is a schematic diagram of a circuit of a Doherty power amplifier according to still another embodiment of the present invention.

FIG. 6 is a schematic diagram of a circuit of a Doherty power amplifier 600 according to still another embodiment of the present invention. The Doherty power amplifier 600 in FIG. 6 is an example of the Doherty power amplifier 500 in FIG. 3 and FIG. 5, and detailed descriptions are appropriately omitted herein.

The Doherty power amplifier 600 includes: a first amplification circuit 510, a second amplification circuit 120, a first power divider 430, a combiner network 640, a second power divider 150, a second phase compensation transmission line 281, a first impedance inversion component 282, a second impedance inversion component 283, and a delay device 384. The first amplification circuit 510, the second amplification circuit 120, the first power divider 430, the second power divider 150, a first phase compensation transmission line 280, the second phase compensation transmission line 281, the first impedance inversion component 282, and the delay device 384 of the Doherty power amplifier 500 are similar to corresponding circuit components of the Doherty power amplifier 500 in FIG. 5, and are not described in detail herein again.

Different from the Doherty power amplifier 500 in FIG. 5, the combiner network 640 includes: a sixth impedance inversion component 641, a seventh impedance inversion component 642, a fourth impedance inversion component 644, and a fifth impedance inversion component 643.

A first end of the sixth impedance inversion component 641 is connected to an output end of a main power amplification branch. A first end of the seventh impedance inversion component 642 is connected to a second end of the sixth impedance inversion component, and a second end of the seventh impedance inversion component is connected to a load 160. A first end of the fourth impedance inversion component 644 is connected to an output end of a first auxiliary power amplification branch, and a second end of the fourth impedance inversion component is connected to an output end of a second auxiliary power amplification branch. A first end of the fifth impedance inversion component 643 is connected to the output end of the second auxiliary power amplification branch, and a second end of the fifth impedance inversion component 643 is connected to the second end of the sixth impedance inversion component.

Specifically, an output end of the second-level auxiliary power amplifier 515 of the first auxiliary power amplification branch is connected to the first end of the fourth impedance inversion component 644, and an output end of the second-level auxiliary power amplifier 518 of the second auxiliary power amplification branch is connected to the second end of the fourth impedance inversion component 644, and is connected to the first end of the fifth impedance inversion component 643.

According to this embodiment of the present invention, multiple levels of cascaded auxiliary power amplifiers may enable an auxiliary power amplifier in a Doherty power amplifier to be almost ideally shut down in terms of a specified threshold, and enable a main power amplifier to be closer to saturation in terms of the specified threshold, thereby improving efficiency of the main power amplifier. An auxiliary power amplifier connected in parallel to a drive amplifier of the main power amplifier achieves an active-load pulling function for the drive amplifier, so that efficiency of the drive amplifier during power back-off is approximate to saturation efficiency, thereby improving efficiency of an entire power amplifier.

Figure 7:
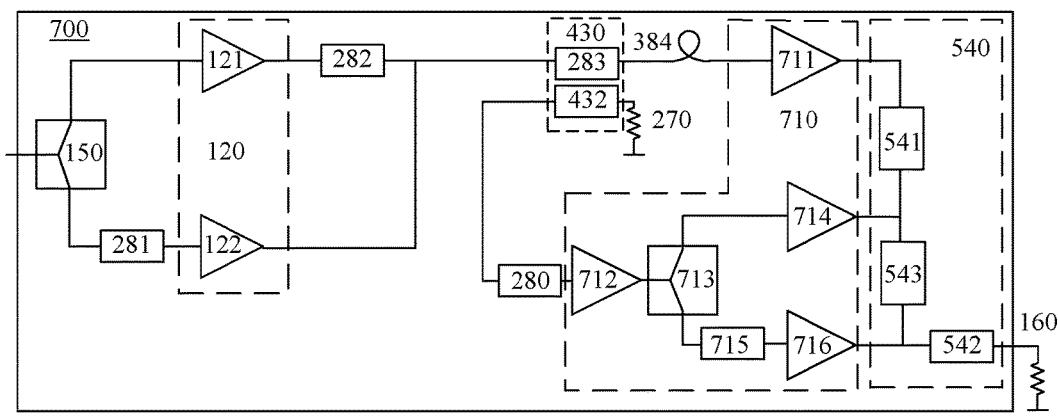
FIG. 7 is a schematic diagram of a circuit of a Doherty power amplifier according to yet another embodiment of the present invention.

FIG. 7 is a schematic diagram of a circuit of a Doherty power amplifier 700 according to yet another embodiment of the present invention. The Doherty power amplifier 700 in FIG. 7 is an example of the Doherty power amplifier 500 in FIG. 5, and detailed descriptions are appropriately omitted herein.

The Doherty power amplifier 700 includes: a first amplification circuit 710, a second amplification circuit 120, a first power divider 430, a combiner network 540, a second power divider 150, a first phase compensation transmission line 280, a second phase compensation transmission line 281, a first impedance inversion component 282, and a delay device 384. The second amplification circuit 120, the first power divider 430, the combiner network 540, the second power divider 150, the first phase compensation transmission line 280, the second phase compensation transmission line 281, the first impedance inversion component 282, and the delay device 384 of the Doherty power amplifier 700 are similar to corresponding circuit components of the Doherty power amplifier 500 in FIG. 5, and are not described in detail herein again.

A difference between the Doherty power amplifier 700 and the Doherty power amplifier 500 in FIG. 5 lies in that: the first amplification circuit 710 includes: a first main power amplifier 711, a first-level auxiliary power amplifier 712, a third power divider 713, and multiple second-level auxiliary power amplifiers, for example, a second-level auxiliary power amplifier 714 of a first auxiliary branch and a second-level auxiliary power amplifier 716 of a second auxiliary branch. An input end of the first-level auxiliary power amplifier 712 is coupled to an input end of the first main power amplifier 711 by using the first power divider 430, an input end of the third power divider 713 is connected to an output end of the first-level auxiliary power amplifier 712, and the third power divider 713 is configured to allocate, to the multiple second-level auxiliary power amplifiers 714 and 716, an amplification signal that is output by the first-level auxiliary power amplifier 712.

Specifically, a first end of the second impedance inversion component 283 is connected to a second end of a phase compensation transmission line 282, and a second end of the second impedance inversion component 283 is connected to the input end of the first main power amplifier 711. A first end of the second transmission line 432 is connected to a first end of the first phase compensation transmission line 280, and a second end of the second transmission line 432 is grounded by using an impedor 270. An output end of the first main power amplifier 711 is connected to a first end of the sixth impedance inversion component 541. A second end of the first phase compensation transmission line 280 is connected to an input end of the first-level auxiliary power amplifier 712. An output end of the first-level auxiliary power amplifier 712 is connected to the input end of the third power divider 713. A first output end of the third power divider 713 is connected to an input end of the second-level auxiliary power amplifier 714, and an output end of the second-level auxiliary power amplifier 714 is connected to a second end of the sixth impedance inversion component 541, and is connected to a first end of the third impedance inversion component 543. A second output end of the third power divider 713 is connected to a first end of a phase compensation transmission line 715. A second end of the phase compensation transmission line 715 is connected to an input end of the second-level auxiliary power amplifier 716. An output end of the second-level auxiliary power amplifier 716 is connected to a second end of the third impedance inversion component 543, and is connected to a first end of the seventh impedance inversion component 542. A second end of the seventh impedance inversion component 542 is connected to a load 160.

According to this embodiment of the present invention, multiple levels of cascaded auxiliary power amplifiers may enable an auxiliary power amplifier in a Doherty power amplifier to be almost ideally shut down in terms of a specified threshold, and enable a main power amplifier to be closer to saturation in terms of the specified threshold, thereby improving efficiency of the main power amplifier. An auxiliary power amplifier connected in parallel to a drive amplifier of the main power amplifier achieves an active-load pulling function for the drive amplifier, so that efficiency of the drive amplifier during power back-off is approximate to saturation efficiency, thereby improving efficiency of an entire power amplifier.

In addition, in this embodiment of the present invention, one auxiliary power amplifier may be used as a drive amplifier to drive two or more auxiliary power amplifiers, and biasing of the auxiliary power amplifier used as the drive amplifier and the two auxiliary power amplifiers is adjusted, so that an effect that is the same as or similar to that of the foregoing embodiment can be achieved, a circuit topology is simpler, and a manufacturing difficulty and manufacturing costs are reduced.

Figure 8:
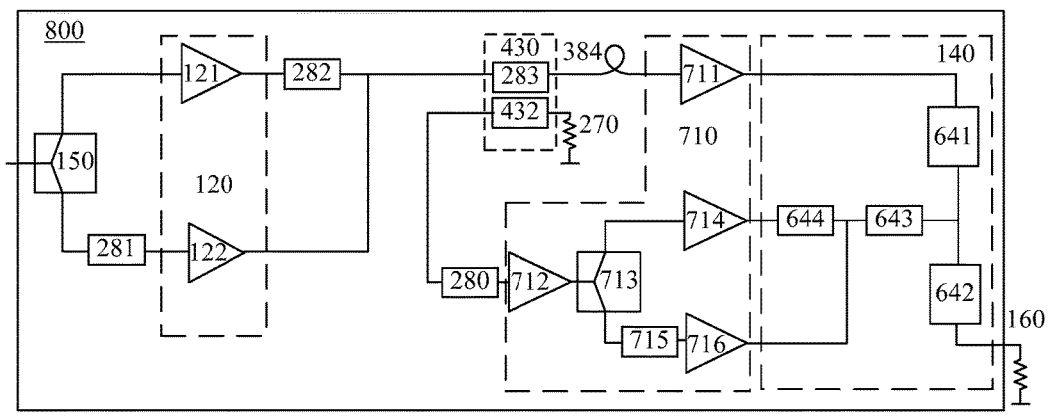
FIG. 8 is a schematic diagram of a circuit of a Doherty power amplifier according to another embodiment of the present invention.

FIG. 8 is a schematic diagram of a circuit of a Doherty power amplifier 800 according to another embodiment of the present invention. The Doherty power amplifier 800 is an example of the Doherty power amplifier 100 in FIG. 3, and detailed descriptions are appropriately omitted herein.

The Doherty power amplifier 800 includes: a first amplification circuit 710, a second amplification circuit 120, a first power divider 430, the combiner network 640, a second power divider 150, a first phase compensation transmission line 280, a second phase compensation transmission line 281, a first impedance inversion component 282, and a delay device 384. The first amplification circuit 710, the second amplification circuit 120, the first power divider 430, the second power divider 150, the first phase compensation transmission line 280, the second phase compensation transmission line 281, the first impedance inversion component 282, and the delay device 384 of the Doherty power amplifier 800 are similar to corresponding circuit components of the Doherty power amplifier 700 in FIG. 7, the combiner network 640 is similar to a corresponding circuit component in FIG. 6, and details are not described herein again. The first power divider 430 includes a second impedance inversion component 283 and a second transmission line 432.

Specifically, a first end of the second impedance inversion component 283 is connected to a second end of the first phase compensation transmission line 282, and a second end of the second impedance inversion component 283 is connected to an input end of the first main power amplifier 711. A first end of the second transmission line 432 is connected to a first end of the first phase compensation transmission line 280, and a second end of the second transmission line 432 is grounded by using an impedor 270. An output end of the first main power amplifier 711 is connected to a first end of the sixth impedance inversion component 641. The second end of the first phase compensation transmission line 280 is connected to an input end of the first-level auxiliary power amplifier 712. An output end of the first-level auxiliary power amplifier 712 is connected to an input end of the third power divider 713. A first output end of the third power divider 713 is connected to an input end of the second-level auxiliary power amplifier 714. An output end of the second-level auxiliary power amplifier 714 is connected to a first end of the fourth impedance inversion component 644. A second end of the fourth impedance inversion component 644 is connected to a first end of the fifth impedance inversion component 643. A second output end of the third power divider 713 is connected to a first end of the phase compensation transmission line 715. A second end of the phase compensation transmission line 715 is connected to an input end of the second-level auxiliary power amplifier 716. An output end of the second-level auxiliary power amplifier 716 is connected to a second end of the fourth impedance inversion component 644, and is connected to the first end of the fifth impedance inversion component 643. A second end of the fifth impedance inversion component 643 is connected to a first end of the seventh impedance inversion component 642, and is connected to a second end of the sixth impedance inversion component 641. A second end of the seventh impedance inversion component 642 is connected to a load 160.

In addition, one auxiliary power amplifier is used as a drive amplifier to drive two or more auxiliary power amplifiers, and biasing of the auxiliary power amplifier used as the drive amplifier and the two auxiliary power amplifiers is adjusted, so that an effect that is the same as or similar to that of the foregoing embodiment can be achieved, a circuit topology is simpler, and a manufacturing difficulty and manufacturing costs are reduced.

To resolve the foregoing technical problem, drive amplifiers of auxiliary power amplifiers may be further cascaded before an auxiliary power amplifier of a Doherty power amplifier, a drive amplifier of a main power amplifier may be cascaded before the main power amplifier, and the drive amplifier of the auxiliary power amplifier is also biased to a class C or a class approximate to a class C, so that an output gain feature of the auxiliary power amplifier has a higher slope, the auxiliary power amplifier is enabled to be almost ideally shut down in terms of a specified threshold, and the main power amplifier is enabled to be closer to saturation in terms of the specified threshold. However, in this technical solution, because an active-load pulling function is not performed on the drive amplifier of the main power amplifier, efficiency during power back-off is far less than saturation efficiency, thereby reducing efficiency of an entire power amplifier.

An embodiment of the present invention provides a Doherty power amplifier, which can improve efficiency of an entire power amplifier.

Figure 9:
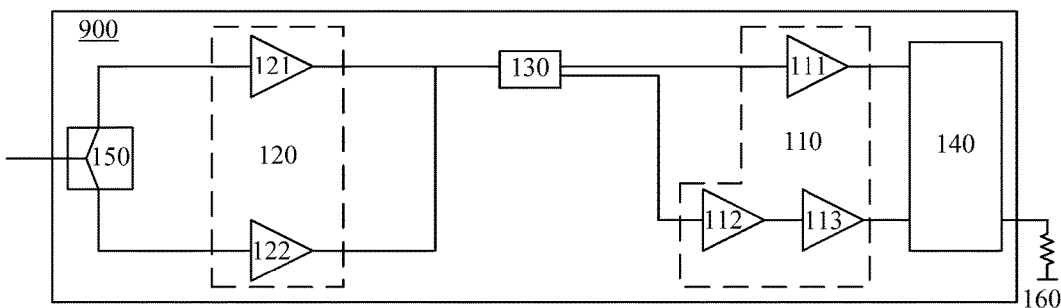
FIG. 9 is a schematic diagram of a circuit of a Doherty power amplifier according to still another embodiment of the present invention.

FIG. 9 is a block diagram of a circuit of a Doherty power amplifier 900 according to an embodiment of the present invention. The Doherty power amplifier 900 includes: a first amplification circuit 110, a second amplification circuit 120, and a first power divider 130, a combiner network 140, and a second power divider 150.

The first amplification circuit 110 includes a main power amplification branch and at least one auxiliary power amplification branch, where the main power amplification branch includes a first main power amplifier 111, each auxiliary power amplification branch of the at least one auxiliary power amplification branch includes multiple levels of auxiliary power amplifiers 112 and 113, the main power amplification branch is configured to output an amplification signal to an output end of the main power amplification branch, and the at least one auxiliary power amplification branch is set to output an amplification signal to an output end of the at least one auxiliary power amplification branch when an output power of the first main power amplifier 111 reaches a first threshold.

The combiner network 140 is configured to: perform impedance inversion on the first amplification circuit 110, and couple the output end of the main power amplification branch and the output end of the at least one auxiliary power amplification branch to a load 160.

The second amplification circuit 120 includes a second main power amplification branch and a second auxiliary power amplification branch that are connected in parallel, where the second main power amplification branch includes a second main power amplifier 121, the second auxiliary power amplification branch includes at least one level of second auxiliary power amplifier 122, the second main power amplification branch is configured to output an amplification signal to an output end of the second amplification circuit 120, to drive the first main power amplifier 111, and the second auxiliary power amplification branch is set to output an amplification signal to the output end of the second amplification circuit 120 when an output power of the second main power amplifier 121 reaches a second threshold.

The first power divider 130 is coupled between the first amplification circuit 110 and the second amplification circuit 120, and is configured to allocate an input signal of the first power divider 130 to the main power amplification branch and the at least one auxiliary power amplification branch.

The second power divider 150 is connected to an input end of the second main power amplification branch and an input end of the second auxiliary power amplification branch, and is configured to allocate an input signal of the Doherty power amplifier to the second main power amplification branch and the second auxiliary power amplification branch.

According to this embodiment of the present invention, multiple levels of cascaded auxiliary power amplifiers may enable an auxiliary power amplifier in a Doherty power amplifier to be almost ideally shut down in terms of a specified threshold, and enable a main power amplifier to be closer to saturation in terms of the specified threshold, thereby improving efficiency of the main power amplifier. An auxiliary power amplifier connected in parallel to a drive amplifier of the main power amplifier achieves an active-load pulling function for the drive amplifier, so that efficiency of the drive amplifier during power back-off is approximate to saturation efficiency, thereby improving efficiency of an entire power amplifier.

Optionally, in another embodiment, the Doherty power amplifier 900 further includes: a first impedance inversion component and a second impedance inversion component that are configured to perform impedance inversion on the second amplification circuit, where the first impedance inversion component is connected in series to the second main power amplifier, and the second impedance inversion component is connected between the first power divider and the first impedance inversion component.

Optionally, in another embodiment, the Doherty power amplifier 900 further includes: a first impedance inversion component, where the first impedance inversion component is connected in series to the second main power amplifier, the first power divider includes a second impedance inversion component and a coupled transmission line, the second impedance inversion component is connected between the output end of the second amplification circuit and the input end of the main power amplification branch, and is configured to perform impedance inversion on the second amplification circuit, one end of the coupled transmission line is connected to the input end of the at least one auxiliary power amplification branch, another end of the coupled transmission line is grounded, and the first impedance inversion component and the second impedance inversion component are configured to perform impedance inversion on the second amplification circuit.

According to this embodiment of the present invention, the at least one level of second auxiliary power amplifier is biased to a class B or a class C, and the second main power amplifier is biased to a class AB.

According to this embodiment of the present invention, the first power divider is a coupler.

According to this embodiment of the present invention, the multiple levels of auxiliary power amplifiers are biased to the class B or the class C, and the first main power amplifier is biased to the class AB.

According to this embodiment of the present invention, the first power divider is a coupler.

It should be noted that after the delay device 384 is omitted in the embodiments in FIG. 2 to FIG. 8, the embodiments in FIG. 2 to FIG. 8 may be used as examples of the Doherty power amplifier 900 of the embodiment in FIG. 9, and details are not described herein again. For example, after the delay device 384 is omitted in the embodiments in FIG. 2 to FIG. 4, the second end of the second impedance inversion component 283 is directly connected to the input end of the first main power amplifier 211. After the delay device 384 is omitted in the embodiments in FIG. 5 and FIG. 6, the second end of the second impedance inversion component 283 is directly connected to the input end of the first main power amplifier 511. After the delay device 384 is omitted in the embodiments in FIG. 7 and FIG. 8, the second end of the second impedance inversion component 283 is directly connected to the input end of the first main power amplifier 711.

Figure 10:
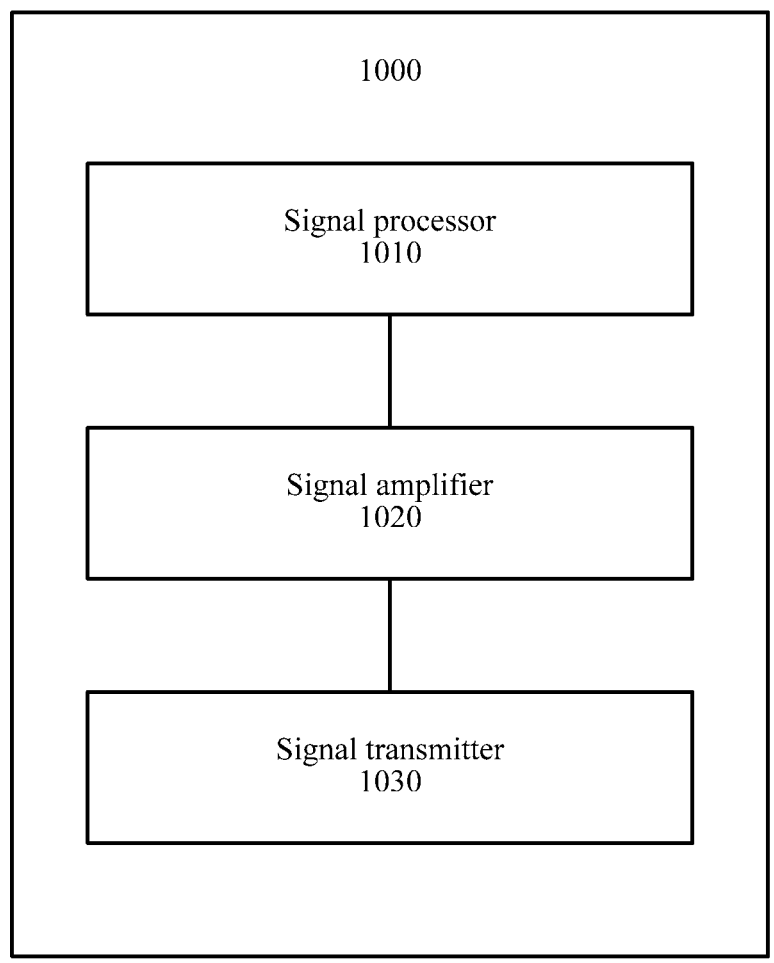
FIG. 10 is a schematic block diagram of a transmitter according to an embodiment of the present invention.

FIG. 10 is a schematic structural diagram of a transmitter 1000 according to an embodiment of the present invention.

The transmitter 1000 includes a signal processor 1010, a signal amplifier 1020, and a signal transmitter 1030. The signal processor 1010 is configured to process a to-be-transmitted signal. The signal amplifier 1020 is the Doherty power amplifier in the embodiments in FIG. 1A to FIG. 9, and is configured to amplify the signal processed by the signal processor. The signal transmitter 1030 is configured to transmit the signal amplified by the signal amplifier.

For example, the transmitter 1000 may be a transmitter of a base station in a communications system. This embodiment of the present invention is not limited thereto. The transmitter 1000 may also be a transmitter of another communications device in the communications system.

In this embodiment of the present invention, auxiliary power amplifiers are cascaded to improve a gain of an auxiliary power amplification branch, and to allocate a relatively high power to a main power amplification branch, thereby improving a gain of an end-level amplification circuit. In addition, in the solutions of the present invention, a drive-level amplification circuit is disposed before the end-level amplification circuit, and is configured to drive the end-level amplification circuit, auxiliary power amplifiers connected in parallel are disposed in the drive-level amplification circuit for a drive amplifier, so that active-load pulling is performed on the drive amplifier, and efficiency of the drive-level amplification circuit is improved. Therefore, efficiency of an entire Doherty power amplifier of the transmitter is improved. Correspondingly, efficiency of the transmitter is improved.

A person of ordinary skill in the art may be aware that, in combination with the examples described in the embodiments disclosed in this specification, units and algorithm steps may be implemented by electronic hardware, computer software, or a combination thereof. To clearly describe the interchangeability between the hardware and the software, the foregoing has generally described compositions and steps of each example according to functions. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in this application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of the present invention essentially, or the part contributing to the prior art, or all or some of the technical solutions may be implemented in the form of a software product. The software product is stored in a storage medium and includes several instructions for instructing a computer device (which may be a personal computer, a server, or a network device) to perform all or some of the steps of the methods described in the embodiments of the present invention. The foregoing storage medium includes: any medium that can store program code, such as a USB flash drive, a removable hard disk, a read-only memory (ROM), a random access memory (RAM, Random Access Memory), a magnetic disk, or an optical disc.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A Doherty power amplifier, comprising:
   a first amplification circuit, comprising a main power amplification branch and at least one auxiliary power amplification branch, wherein the main power amplification branch comprises a first main power amplifier, each auxiliary power amplification branch of the at least one auxiliary power amplification branch comprises multiple levels of auxiliary power amplifiers, the main power amplification branch is configured to output an amplification signal to an output end of the main power amplification branch, and the at least one auxiliary power amplification branch is configured to output an amplification signal to an output end of the at least one auxiliary power amplification branch when an output power of the first main power amplifier reaches a first threshold;
   a delay device, connected in the main power amplification branch, and configured to compensate for a delay difference between the main power amplification branch and the at least one auxiliary power amplification branch;
   a combined network, configured to: perform impedance inversion on the first amplification circuit, and couple the output end of the main power amplification branch and the output end of the at least one auxiliary power amplification branch to a load;
   a first power divider, connected to an input end of the main power amplification branch and an input end of the at least one auxiliary power amplification branch, and configured to allocate an input signal of the first power divider to the main power amplification branch and the at least one auxiliary power amplification branch; and
   a third power divider, wherein the at least one auxiliary power amplification branch comprises: multiple auxiliary power amplification branches, wherein an input end of the third power divider is coupled to an input end of the first main power amplifier by the first power divider, and the third power divider is configured to allocate, to the multiple auxiliary power amplification branches, a signal that is output by the first power divider.

2. A Doherty power amplifier, comprising:
   a first amplification circuit, comprising a main power amplification branch and at least one auxiliary power amplification branch, wherein the main power amplification branch comprises a first main power amplifier, each auxiliary power amplification branch of the at least one auxiliary power amplification branch comprises multiple levels of auxiliary power amplifiers, the main power amplification branch is configured to output an amplification signal to an output end of the main power amplification branch, and the at least one auxiliary power amplification branch is set to output an amplification signal to an output end of the at least one auxiliary power amplification branch when an output power of the first main power amplifier reaches a first threshold;
   a delay device, connected in the main power amplification branch, and configured to compensate for a delay difference between the main power amplification branch and the at least one auxiliary power amplification branch;
   a combined network, configured to: perform impedance inversion on the first amplification circuit, and couple the output end of the main power amplification branch and the output end of the at least one auxiliary power amplification branch to a load;
   a first power divider, connected to an input end of the main power amplification branch and an input end of the at least one auxiliary power amplification branch, and configured to allocate an input signal of the first power divider to the main power amplification branch and the at least one auxiliary power amplification branch;
   a second amplification circuit, comprising a second main power amplification branch and a second auxiliary power amplification branch that are connected in parallel, wherein the second main power amplification branch comprises a second main power amplifier, the second auxiliary power amplification branch comprises at least one level of second auxiliary power amplifier, the second main power amplification branch is configured to output an amplification signal to an output end of the second amplification circuit, to drive the first main power amplifier, and the second auxiliary power amplification branch is configured to output an amplification signal to the output end of the second amplification circuit when an output power of the second main power amplifier reaches a second threshold; and
   a second power divider, connected to an input end of the second main power amplification branch and an input end of the second auxiliary power amplification branch, and configured to allocate an input signal of the Doherty power amplifier to the second main power amplification branch and the second auxiliary power amplification branch, wherein
   the first power divider is coupled between the first amplification circuit and the second amplification circuit, and is configured to allocate, to the main power amplification branch and the at least one auxiliary power amplification branch, an amplification signal that is output by the second amplification circuit.

3. The Doherty power amplifier according to claim 2, further comprising: a first impedance inversion component and a second impedance inversion component that are configured to perform impedance inversion on the second amplification circuit, wherein the first impedance inversion component is connected in series to the second main power amplifier, and the second impedance inversion component is connected between the first power divider and the first impedance inversion component.

4. The Doherty power amplifier according to claim 2, further comprising: a first impedance inversion component, wherein the first impedance inversion component is connected in series to the second main power amplifier, the first power divider comprises a second impedance inversion component and a coupled transmission line, the second impedance inversion component is connected between the output end of the second amplification circuit and the input end of the main power amplification branch, and is configured to perform impedance inversion on the second amplification circuit, one end of the coupled transmission line is connected to the input end of the at least one auxiliary power amplification branch, another end of the coupled transmission line is grounded, and the first impedance inversion component and the second impedance inversion component are configured to perform impedance inversion on the second amplification circuit.

5. The Doherty power amplifier according to claim 2, further comprising: at least one second phase compensation transmission line, disposed in the second main power amplification branch and the second auxiliary power amplification branch, and configured to adjust a phase difference between the second main power amplification branch and the second auxiliary power amplification branch.

6. The Doherty power amplifier according to claim 2, wherein the at least one level of second auxiliary power amplifier is biased to a class B or a class C, and the second main power amplifier is biased to a class AB.

7. The Doherty power amplifier according to claim 1, wherein the first power divider is a coupler.

8. The Doherty power amplifier according to claim 1, wherein the at least one auxiliary power amplification branch comprises: one auxiliary power amplification branch, wherein the multiple levels of auxiliary power amplifiers of the auxiliary power amplification branch are connected in series between an input end of the auxiliary power amplification branch and an output end of the auxiliary power amplification branch.

9. A Doherty power amplifier, comprising:
a first amplification circuit, comprising a main power amplification branch and at least one auxiliary power amplification branch, wherein the main power amplification branch comprises a first main power amplifier, each auxiliary power amplification branch of the at least one auxiliary power amplification branch comprises multiple levels of auxiliary power amplifiers, the main power amplification branch is configured to output an amplification signal to an output end of the main power amplification branch, and the at least one auxiliary power amplification branch is set to output an amplification signal to an output end of the at least one auxiliary power amplification branch when an output power of the first main power amplifier reaches a first threshold;
a delay device, connected in the main power amplification branch, and configured to compensate for a delay difference between the main power amplification branch and the at least one auxiliary power amplification branch;
a combined network, configured to: perform impedance inversion on the first amplification circuit, and couple the output end of the main power amplification branch and the output end of the at least one auxiliary power amplification branch to a load;
a first power divider, connected to an input end of the main power amplification branch and an input end of the at least one auxiliary power amplification branch, and configured to allocate an input signal of the first power divider to the main power amplification branch and the at least one auxiliary power amplification branch, wherein the at least one auxiliary power amplification branch comprises: a third power divider, one first-level auxiliary power amplifier, and multiple second-level auxiliary power amplifiers, wherein an input end of the first-level auxiliary power amplifier is coupled to an input end of the first main power amplifier by the first power divider, an input end of the third power divider is connected to an output end of the first-level auxiliary power amplifier, and the third power divider is configured to allocate, to the multiple second-level auxiliary power amplifiers, an amplification signal that is output by the first-level auxiliary power amplifier.

10. The Doherty power amplifier according to claim 1, further comprising: at least one first phase compensation transmission line, disposed in the main power amplification branch and the at least one auxiliary power amplification branch, and configured to adjust a phase difference between the main power amplification branch and the at least one auxiliary power amplification branch.

11. The Doherty power amplifier according to claim 1, wherein the multiple levels of auxiliary power amplifiers are biased to the class B or the class C, and the first main power amplifier is biased to the class AB.

12. The Doherty power amplifier according to claim 1, wherein the combiner network comprises: at least one impedance inverter, and the delay device is a delay line.

13. A Doherty power amplifier, comprising:
a first amplification circuit, comprising a main power amplification branch and at least one auxiliary power amplification branch, wherein the main power amplification branch comprises a first main power amplifier, each auxiliary power amplification branch of the at least one auxiliary power amplification branch comprises multiple levels of auxiliary power amplifiers, the main power amplification branch is configured to output an amplification signal to an output end of the main power amplification branch, and the at least one auxiliary power amplification branch is configured to output an amplification signal to an output end of the at least one auxiliary power amplification branch when an output power of the first main power amplifier reaches a first threshold;
a combiner network, configured to: perform impedance inversion on the first amplification circuit, and couple the output end of the main power amplification branch and the output end of the at least one auxiliary power amplification branch to a load;
a second amplification circuit, comprising a second main power amplification branch and a second auxiliary power amplification branch that are connected in parallel, wherein the second main power amplification branch comprises a second main power amplifier, the second auxiliary power amplification branch comprises at least one level of second auxiliary power amplifier, the second main power amplification branch is configured to output an amplification signal to an output end of the second amplification circuit, to drive the first main power amplifier, and the second auxiliary power amplification branch is configured to output an amplification signal to the output end of the second amplification circuit when an output power of the second main power amplifier reaches a second threshold;

a first power divider, coupled between the first amplification circuit and the second amplification circuit, and configured to allocate an input signal of the first power divider to the main power amplification branch and the at least one auxiliary power amplification branch; and a second power divider, connected to an input end of the second main power amplification branch and an input end of the second auxiliary power amplification branch, and configured to allocate an input signal of the Doherty power amplifier to the second main power amplification branch and the second auxiliary power amplification branch.

14. The Doherty power amplifier according to claim 13, further comprising: a first impedance inversion component and a second impedance inversion component that are configured to perform impedance inversion on the second amplification circuit, wherein the first impedance inversion component is connected in series to the second main power amplifier, and the second impedance inversion component is connected between the first power divider and the first impedance inversion component.

15. The Doherty power amplifier according to claim 13, further comprising: a first impedance inversion component, wherein the first impedance inversion component is connected in series to the second main power amplifier, the first power divider comprises a second impedance inversion component and a coupled transmission line, the second impedance inversion component is connected between the output end of the second amplification circuit and an input end of the main power amplification branch, and is configured to perform impedance inversion on the second amplification circuit, one end of the coupled transmission line is connected to an input end of the at least one auxiliary power amplification branch, another end of the coupled transmission line is grounded, and the first impedance inversion component and the second impedance inversion component are configured to perform impedance inversion on the second amplification circuit.

16. The Doherty power amplifier according to claim 14, wherein the at least one level of second auxiliary power amplifier is biased to a class B or a class C, and the second main power amplifier is biased to a class AB.

17. The Doherty power amplifier according to claim 13, wherein the first power divider is a coupler.

18. The Doherty power amplifier according to claim 13, wherein the multiple levels of auxiliary power amplifiers are biased to the class B or the class C, and the first main power amplifier is biased to the class AB.

19. The Doherty power amplifier according to claim 2, wherein the combiner network comprises at least one impedance inverter, and the delay device is a delay line.

* * * * *